United States Patent [19]

Simons et al.

[11] 4,040,788

[45] Aug. 9, 1977

[54] APPARATUS, INSTRUMENTATION, AND METHOD FOR COMPARING SAMPLES

[75] Inventors: Sanford L. Simons, Morrison; Frederick M. McNeill, Denver, both of Colo.

[73] Assignee: Sanford L. Simons, Morrison, Colo.

[21] Appl. No.: 673,765

[22] Filed: Apr. 5, 1976

[51] Int. Cl.$^2$ ................... G01N 33/16; G01N 21/28
[52] U.S. Cl. ........................... 23/230 R; 23/253 R; 23/259; 235/151.35
[58] Field of Search ............... 23/259, 253 R, 230 R; 235/151.35, 59 R; 356/39, 42

[56] References Cited

U.S. PATENT DOCUMENTS

| | | | |
|---|---|---|---|
| 3,535,084 | 10/1970 | Izawa et al. | 23/253 X |
| 3,764,268 | 10/1973 | Kosowsky et al. | 23/253 R |
| 3,799,744 | 3/1974 | Jones | 23/253 R |
| 3,874,850 | 4/1975 | Sorensen et al. | 23/253 X |
| 3,881,872 | 5/1975 | Naono | 23/259 X |
| 3,883,305 | 5/1975 | Hoskins et al. | 23/253 R |
| 3,918,910 | 11/1975 | Soya et al. | 235/151.35 X |
| 3,960,497 | 6/1976 | Acord | 235/151.35 X |

*Primary Examiner*—R.E. Serwin
*Attorney, Agent, or Firm*—C. B. Messenger

[57] ABSTRACT

Instrument apparatus and method for the cyclically concurrent display of the time related transitional characteristics of a plurality of samples, at least one of which may be a laboratory standard of known value, or all of which samples may be unknown. Separate electrical signals derived as the samples are simultaneously activated, exposed, treated, analyzed or observed are gated by multiplexing circuits on a split time basis that may allot equal or varied time periods for the separate samples. The strength of the signal from the samples may be separately or cooperatively adjusted to enhance comparison or differential features as the signals are delivered to display components for study or recording. Where strip chart or other index marking recorders having a time related movement pattern are utilized, the sequential signals derived for each sample progressively provide traces, the length or arc of which is a derivative of the then occurring rate of reaction for the sample and the process to which it is being subjected, and this trace length then provides a graphical representation of the instantaneous slope or rate of change for that sample. As an example, the apparatus is used in aggregation or other studies of blood samples wherein components of the instrument provide a controlled temperature environment, rate controlled and identical stirring, even lighting with ambient light influence correction, and selective release and recording of single or multiple signals.

42 Claims, 9 Drawing Figures

APPARATUS, INSTRUMENTATION, AND METHOD FOR COMPARING SAMPLES

BACKGROUND OF THE INVENTION

In laboratory operations, samples, the characteristics of which are unknown, may often be subjected to controlled environmental influences so that observations can be made of changes in the samples. Qualitative studies of individual samples are often made through comparison with the results obtained when a known substance that may be of different or the same composition as the unknown sample is subjected to the same influences and testing. Under other circumstances where a readout standard has been established, it is often desirable to measure progressive results as a plurality of separate samples are subjected to regulated treatment with separate readouts being provided for each sample to be compared against known standards or usually observed characteristics. The provision of a unitary testing and treatment instrument that has capability for simultaneously testing a plurality of samples or that has a built-in capability for evaluating properties of separate samples on a cyclical basis so that the reaction characteristics of each sample can be observed in juxtaposed relationship is believed to be advantageous.

Instrumentation of the foregoing type providing a multiple sample capability wherein the samples may be run concurrently as they are subjected to the same environmental and testing influences can provide an improved result when measured against instruments that do not have a capability for testing multiple samples or that do not provide simultaneous readouts from a plurality of samples in a manner that avoids a requirement for interpolation of test results due to inherent differences in separate test or recording instruments.

At the present time various types of apparatus are provided for the study of blood and other biological fluids or of industrial compounds wherein differences in the transmission of light through the sample is noted as samples of such substances are subjected to progressive test conditions. Current studies in the field of blood chemistry wherein light transmissivity is of interest include studies of platelet aggregation, coagulation and clotting time, and in evaluations of anti-coagulants, etc.

SUMMARY OF THE INVENTION

The present invention relates to apparatus for simultaneously subjecting a plurality of biological fluids and the like to controlled treatment processes that are inclusive of a regulated, controlled and status indicated temperature and to controlled stirring operations of regulated and identical speed, and further to additional instrumentation and control apparatus which makes it possible to subject the individual samples to balanced lighting conditions so that the light transmissivity of the individual samples will provide signal outputs, the relative strengths of which can be cooperatively balanced for the emphasis of similarities or differences before release on a multiplexed and split time basis to meters for observation or for direct permanent chart recording. To enhance the opportunities for comparing or differentiating the characteristics of separate samples, the balance adjusted signals related to the separate samples may be released on a split time basis established by the multiplexing circuits to a single recording pen of a strip chart or other recorder. The cyclically alternating basis can provide separate chart readouts that effectively define a plurality of curves in a side-by-side relationship that facilitates direct and visual comparison. If the chart recording time segments allotted for each sample are equal, the length of line drawn by the single pen in tracing the characteristic curve for one sample before the signal output is switched to another sample will be a measure of the then occuring rate of change for such sample. In essence, the length of the cyclically drawn segment lines is a direct reading of the slope of the curve then being recorded. In analyzing the test results, measurements of such length or visual observations thereof will give a direct indication of the rate of change characteristics for each sample. Significant or abrupt changes in such slope derivative or length of the segmental trace line can be indicative of changes of state for the related sample. A method approach for the evaluation of samples and unknowns is embodied in the provision of the multiplexed signal outputs so that the characteristic curves for separate samples are derived cyclically on a timed segment basis whereby the length of segmental traces becomes a direct measure of the rate of change for the sample being analyzed.

The described apparatus, instrumentation and method is adaptable for use in connection with many and varied fluid or other sample studies and investigations irrespective of whether the output signal is dependent on light transmissivity or not. Accordingly, the invention is believed to be broader than its direct exemplification in the following described embodiments which are illustrative of the advantages inherent in the invention in connection with the study of biological fluids, such as blood or blood fractions.

DESCRIPTION OF PREFERRED EMBODIMENTS

Figure 1:
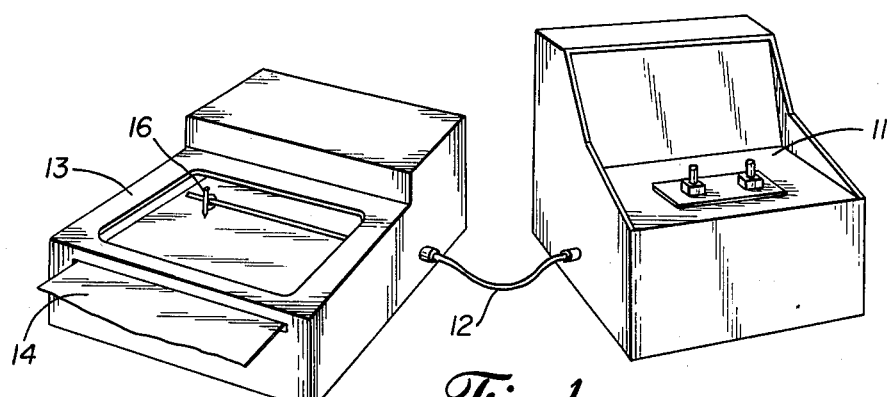
FIG. 1 is a perspective illustration of an aggregation meter and a strip chart recorder.

A preferred embodiment of the invention is shown in FIGS. 1 through 9. An aggregation meter is shown and illustrated for the purpose of illustrating the capabilities of the invention, representative components, and the method embodied therein. The aggregation meter 11 made in accordance with this invention as shown in FIG. 1 is connected by a line 12 to strip chart recorder 13 which may be of conventional construction. The particular strip chart recorder 13 shown and utilized in keeping with the present embodiment of the invention is one having only a single recorder pen 16 with capability for operation on input signals of zero to ten millivolts. When the recorder is on, the chart paper 14 will be advanced in contact with and beneath the recorder pen 16. The recorder pen in the usual manner marks a line or record on the chart with the line progressively showing the status and value of the input signals.

Figure 2:
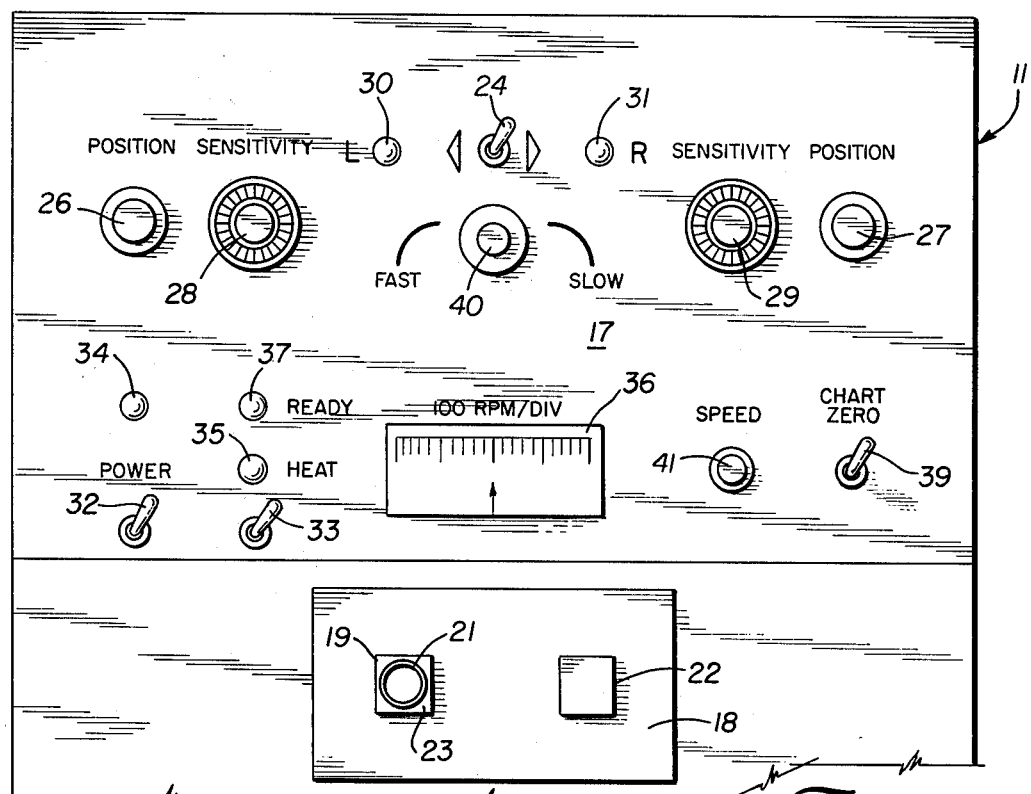
FIG. 2 is a layout face diagram for an aggregation meter embodiment of the invention.

FIG. 2 is a layout representation of control and status indicating components of an aggregation meter made in accordance with the present invention. For this installation the total meter 11 is seen to be inclusive of a dial and control face 17 and a base 18. The base 18 has deep well type receptacles 19 and 22 provided, respectively, for left and right samples. Cuvettes of size corresponding to the size and shape of the receptacles 19 and 22 can be inserted directly in the receptacles 19 and 22, or smaller cuvettes may be used. Actually the receptacles cut in the base 18 have a cross-sectional size of one-half inch square. Where round cuvettes are to be used in place of the also available square cuvettes, an adapter, such as the adapter 23, is inserted in the receptacle, and the adapter 23 provides a round cylindrical opening for closely receiving the cylindrical cuvette 21. While a cuvette 21 of approximately 8 millimeter size is shown in place, other adapters are provided for cuvettes of lesser size.

A light passage is provided through the base in the lower positions of the receptacle that extends from a central position outwardly through and past the receptacles 19 and 22. The light source or sources for this particular embodiment of the invention is disposed centrally, and the light sensitive elements are disposed outboard of the receptacles so that light emitted from the light source will pass through the receptacle area and actually through any adapters or any cuvettes that are received therein. Though the actual light passage is below the upper surface of the block 18 and approximately one-half inch therebelow, it is possible that light from the room or ambient light may be introduced into the receptacle or through the cuvettes that would change the readings that might be obtained. In order to avoid any ambient light interference, a shield can be provided that would cover the entire block, or as in the present invention, an ambient light correction circuit is provided.

The remainder of FIG. 2 illustrates the control face 17 of the aggregation meter instrument. Here it will be seen that the controls are in general separated to provide separate left and right components. A control switch 24 positioned in the upper center of the face can be moved to a left, right or neutral position in order to activate the left or right light sensing components, or, when the switch is in the middle position, both the left and right components will be activated. For the components identified with the left cuvettes and any sample therein, a position adjustment switch 26 and a sensitivity knob 28 is provided. The right components have a position adjustment 27 and a sensitivity control 29. When the switch 24 is moved to the left or the right, a signal light will be turned on, the left light 30 indicates that left signal output circuits are activated and the right signal light 31 indicates that the right signal apparatus will be activated. When the switch 24 is in a neutral position, both lights 30 and 31 will be on, and both channels of the device will be operative. The particular lights 30 and 31 used are generally of the light emitting diode type, and they are connected in their respective circuits in a manner so that they will be lighted at proper times.

A power switch 32 is positioned in the lower left corner, and a signal light 34 in a corresponding position indicates when the power is turned on. Closely adjacent thereto is a heat or temperature control switch 33, and directly above the switch are two light emitting diodes 35 and 37 which separately indicate that the circuit is heating or that the circuit has attained a desired temperature and tests may begin. Labels for L.E.D. 35 indicate "Heat", and the label for the light 37 indicates "Ready".

Disposed centrally in the lower portion of the control face is a speed indicating register 36 which has a pointer dial that moves left and right to indicate the sample stirring speed then being used. At the right of face 17 a chart zero switch 39 is provided adjacent to the knob of speed control 41. Centrally and just below the switch 24 is a control knob 40 which may be moved to various adjusted positions in order to increase or decrease the multiplexing or signal switching rate for the device. If the knob is turned counterclockwise, a faster cycle time will be used, whereas if the knob 40 is turned clockwise, the multiplexing or signal transfer rate will be slowed. The signal switching or multiplexing capabilities of the present device and, in fact, of the present invention are of prime importance to the invention. The components which make such signal switching possible are described subsequently in connection with the description of FIG. 7. For the present it would be well to note that when the switch 24 is in the mid or neutral position, the lights 30 and 31 will alternately come on as a signal is being read from the left or right sample. Further, if aggregation meter 12 is connected to a strip chart recorder 13 as shown in FIG. 1, the single recorder pen 16 will alternately move to positions across the face of the chart which correspond to the signal then being received from the left or right channels of the device.

Figure 3:
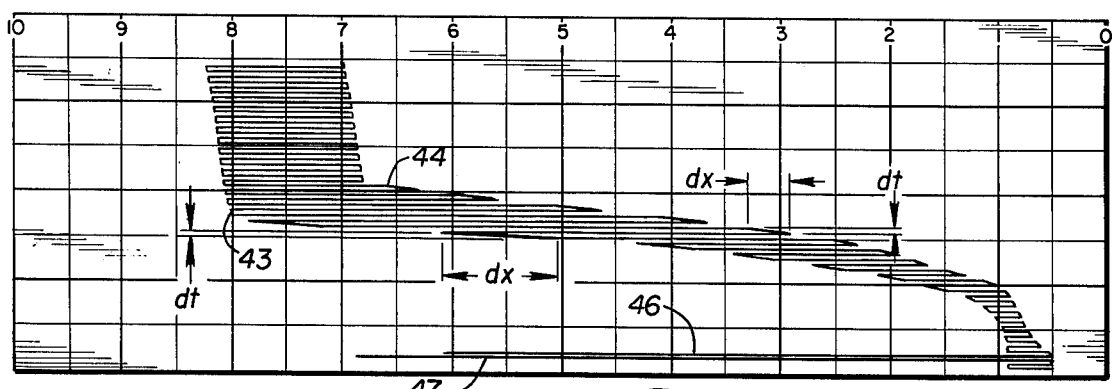
FIG 3 is a representative strip chart as might be derived from use of the aggregation meter and single pen recorder.

A representative output from the apparatus is shown in FIG. 3, which happens to be a study of blood coagulating reactions when blood samples are treated with calcium chloride solution. The interrupted left trace 43 is made when signals are cyclically received from the left sample holder, while the progressively developed curve 44 shows reactions in the right sample. When the signal switching components of the present invention are being utilized, the curve for the left sample or the curve for the right sample will actually be interrupted as the pen moves along the interconnecting lines 45 to first mark a signal corresponding to the curve for the left sample 43, and alternately, it moves next to mark a portion of the curve for the right sample identified in order by the numerals 44. The interconnecting parallel lines are also made by the recording pen 16 as it moves in time sequence from left to right and from right to left. If the multiplexer is set to give an equal time interval to the left signal and to the right signal, the interconnecting parallel lines will all be equally spaced one from the other as shown in FIG. 3. This provision of an equal time spacing between allotments for either the left or right signal in cyclical and serial arrangement presents an additional feature of the present invention, since the length of the interrupted segmental traces being made on the left curve or the length of the segment traces being made on the right curve will correspond directly to the amount of change that is being experienced by that particular sample during the time period alloted for readings of that sample.

In the FIG. 3 presentation the start of the process is indicated by the long lines 46 and 47 with the line 46 and the line 47 providing an indication of when the left and right samples were disturbed by the introduction of the calcium chloride. From this zero time point the reactions start quite rapidly, and it will be noted that the sample in the left cuvette, as progressively indicated by the time segmented curve 43, has a tendency to get to a light occluding condition more readily than that for the right cuvette, as indicated by the interrupted curve 44. For this type of coagulation study, the blood or sample being treated will be more light transmissive when the process starts at the zero points 46 and 47. As clots form, the amount of light being transmitted through the cuvette sample holders will be decreased by reason of the interference of the clots. Accordingly, for these tests, the higher light transmission condition is at the right side of the chart with the lesser light transmissivity being disposed at the left of the chart.

In other studies this same condition may not obtain, and, accordingly, the program of the curve being drawn will move from one condition of light transmissivity to another changed condition. In setting up the instrument it is desirable that it first be known whether there will be more or less light transmission at the end of the process, and the chart can, accordingly, be set to extend from a starting zero to a final reading at the opposite side of the strip chart. In order to change the orientation for the recording pen to a desired starting side of the chart, the plug-ins for the line 12 can simply be reversed, and the recorder pen 16 will then move to an opposite starting position.

The components and circuits which make it possible in keeping with the present invention to provide an output trace, such as that shown in FIG. 3, are shown and will be further described in connection with the schematic diagrams presented in FIGS. 4 through 9 submitted herewith. These Figures show the circuit diagrams that provide the multiple capabilities of the invention, and from such circuit diagrams and associated working parts, the means for attainment of the desired signals and results is described. Before referring to such Figures, however, it perhaps should now be stated that while the presently described embodiment of the invention is an aggregation meter, the principles of the invention are adaptable to other devices and instruments. The general purpose of the described apparatus embodiment is to study the aggregation of platelets in whole blood or plasma samples under regulable conditions for time, temperature and/or stirring.

Figure 4:
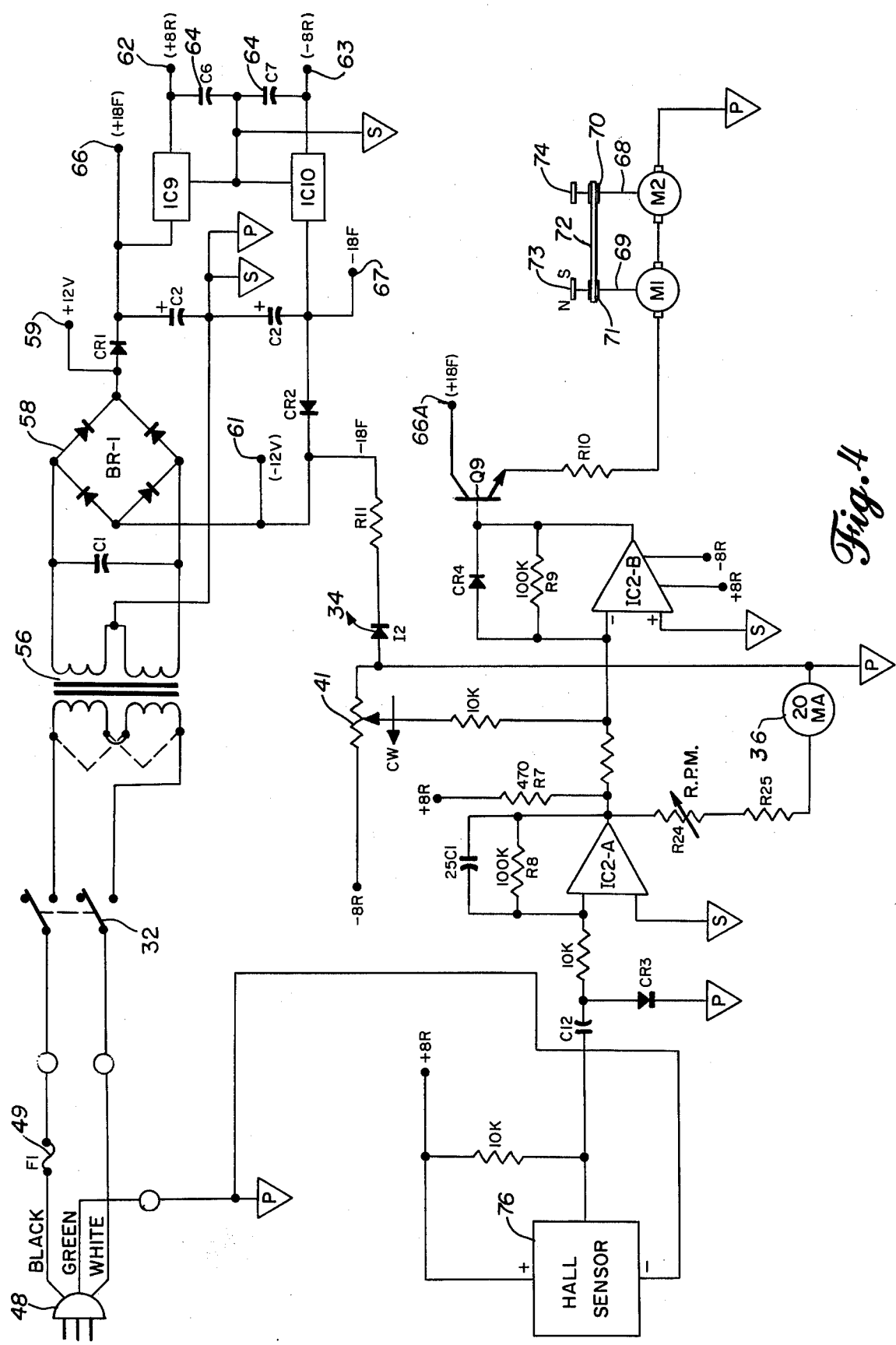
FIG. 4 is a schematic circuit diagram showing the power supply and speed control components of an aggregation meter.

In FIG. 4 a power plug 48 is shown which has three leads indicated as black, green and white. Single phase input power of up to 230 volts A.C. can be introduced at such plug. In normal circumstances the power used will be 110 volt, 60 cycle, A.C. The apparatus, however, is adaptable for use in foreign countries where 90 volt, 50 cycle, A.C. may be used. This input power supply is connected through a fuse 49 and switch 32 to a transformer 56. The windings of the transformer are arranged to provide output power of plus and minus value at legs opposite the provided center tap. This output power is introduced to a full wave rectifier 58, and a pulsating D.C. output is delivered to the +H output at 59 and to a −H output at 61. The full unregulated plus and minus outputs of approximately 18 volts are coupled through diodes CR1 and CR2 to voltage regulators IC9 and IC10. These particular integrated circuit type regulators have an internal reference permitting inputs of from 10 to 30 volts, and the internal gain of the IC circuits is designed, for this instance, to provide an output regulated power at +8 volts indicated as +8R at 62 and a −8 volts regulated at 63. Capacitor filters 64 are provided to control excess impedance gains due to high frequencies and to block any back e.m.f.'s that may occur. Separate outputs 66 and 67 past diodes CR1 and CR2 provide plus and minus 18 volt filtered power sources for other use in temperature status, stirring motor, and multiplexing indicator components of the apparatus.

At any time that the power switch 32 is on, the −18 volts filtered is introduced past L.E.D. 34 which indicates that the power is on. At the same time, +18 volts filtered from the power supply at point 66 is connected to transmitter follower Q9. The +18 volt source is connected to the collector of Q9, and the output from the emitter thereof is itself connected through resistance R10 to the stirring motors M1 and M2. This motor connection is made in series, but it should further be noted that the shafts 69 and 68 for the left and right motors, respectively, are provided with pulleys 71 and 70 that are interconnected by a drive belt 72. Accordingly, though these motors are connected in series, they will be restrained to rotate at the same speed by reason of the mechanical connection provided by belt 72.

The upper ends of the motor shafts have magnet pieces 74 and 73 which are actually disposed beneath the right and left cuvettes, respectively. These magnets are used to effect a stirring of the materials in the cuvettes, though they are not positioned within the cuvettes. The desired stirring is obtained by providing magnetic or magnetisable stirring bars which are placed within the cuvettes and directly in the sample to be stirred. When motors M2 and M1 and their respective shafts are rotated, the magnetic drive pieces 74 and 73 will be rotated. As these magnetic drive pieces rotate, the stirring rods (not shown) which are positioned in the cuvettes will themselves be rotated in a manner that will cause stirring of the materials being treated.

From the foregoing it is seen that the speed of the motors M1 and M2 is regulated by the output from the emitter of Q9. The voltage passing Q9, however, is controlled by the voltage impressed at the base of such transistor. This voltage input from the output of op amp IC2-B is itself controlled by several different components shown in this stirring speed control circuit which includes a Hall sensor 76. The Hall sensor is positioned close to a magnet drive 73 or 74, and it generates pulses as it is turned on and off by the rotating magnets. The output negative pulses are coupled through capacitor C12 as the positive pulses are passed by clamping diode CR3 to a power ground and, accordingly, are not introduced to integrating op amp IC2-A. The integrated negative pulse voltage output from IC2-A and its feedback capacitor and resistance R8 is next summed and amplified by IC2-B together with the voltage derived from the wiper of speed control 41. It is the summed and amplified output signal from IC2-B that is applied to the base of Q9 to control the voltage passed to the stirring motors M1 and M2. With this arrangement, speed of the stirring motors is dependent on the setting of the speed control 41 and the counted pulses from the Hall sensor 76. The system operates to hold the stirring speed at the desired rate.

At the same time the output voltage from IC2-A provides a current which passes variable resistor R24 and resistor R25 to be introduced to speed indicating register 36. This milliampmeter and the input thereto as balanced by R24 is calibrated to read 100 R.P.M. per division on the meter face. Stirring speeds of from 600 to 1400 R.P.M. are commonly used with 1000 R.P.M. (a convenient standard) being at mid-dial position.

Figure 5:
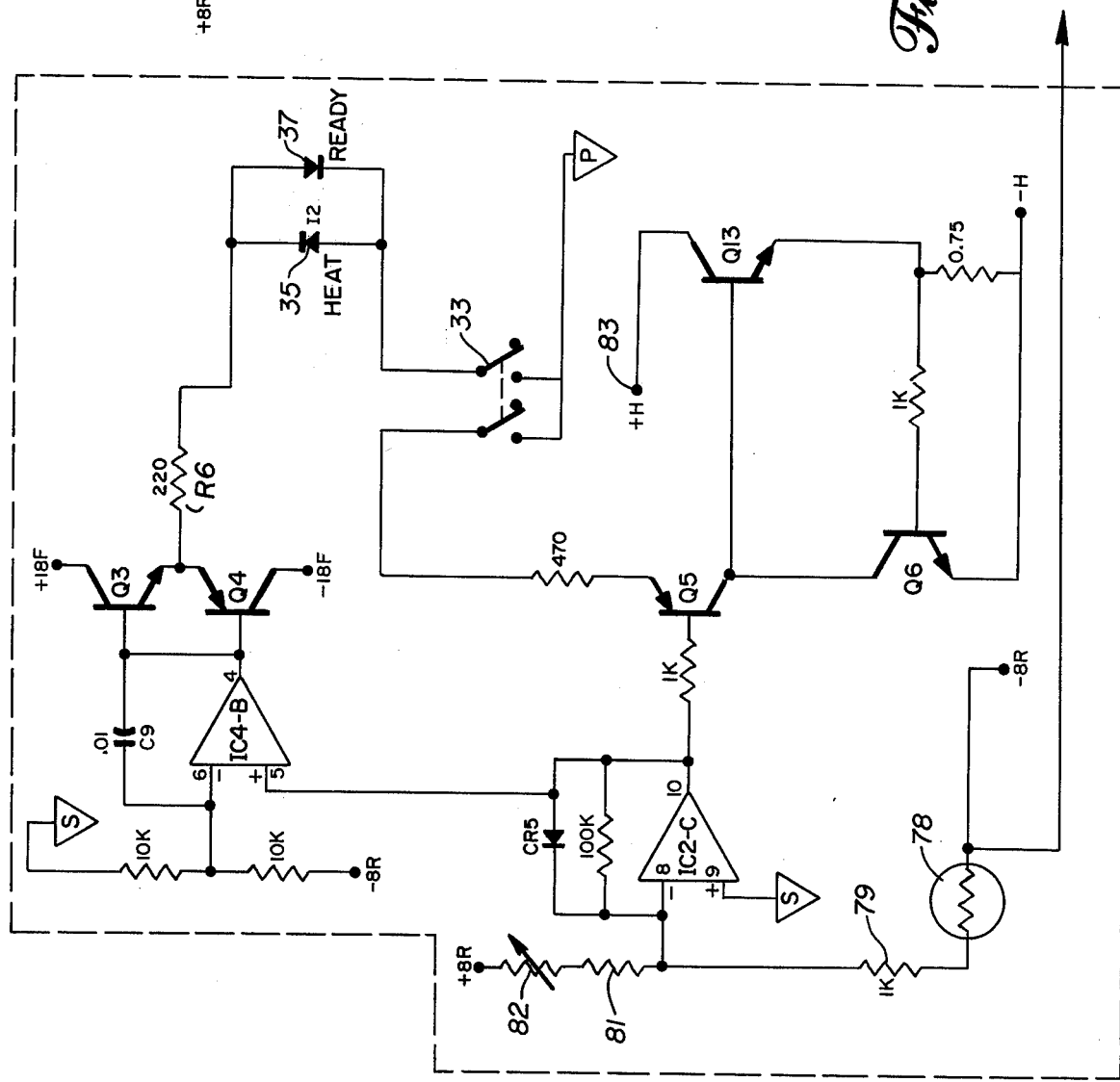
FIG. 5 is a circuit diagram showing the temperature control and temperature sensor components of the preferred aggregation meter embodiment.

Features of temperature status and temperature control components of an embodiment of the present invention are shown in FIG. 5. In this representation the main operative elements are the transistor Q13 which is actually the heater that provides heat to the cuvette receiving block 18, a thermistor 78 which has a changed resistance with changes in temperature, and the indicators 35 and 37 which are L.E.D.s that can be observed when looking at the instrument face 17. In order to obtain a desired temperature of approximately 37° C. for the cuvette holding block, the transistor Q13, which is of a current limiter type, is supplied with unregulated power +H at the point 83. The conductance through Q13 is, of course, controlled by the voltage applied to the base thereof, and the signal that is to be applied to the base of Q13 is controlled by other components of the illustrated circuit. Since the heater in this instance is a transistor, the operation of the heater source can be controlled by the other circuits, and in essence then the heating element is also the switch which controls application of the heat to the block. In operation of the temperature control components, thermistor 78 senses the present temperature of the block, and its resistance increases and decreases in accordance with such temperature. The thermistor 78 and a further resistor 79 are in a circuit from the −8 volt regulated power, and the output past 78 and 79 is connected to an input pin on operational amplifier IC2-C. At the same time a +8 volt regulated power source is connected through the temperature setting variable resistor 82 and the resistance 81 to the same input pin. The operation, therefore, of op amp IC2-C at any setting of variable resistor 82 will be determined by the changes in resistance for thermistor 78. By reason of design characteristics of the circuit, it is intended that IC2-C will be subjected essentially to the full −8 volt source when the block is cold, whereas when the block is near the desired elevated temperature, IC2-C will have a voltage of approximately −2 volts. If the temperature control switch 33 first shown in FIG. 2 is turned on and while the block is heating, the voltage passing IC2-C will be negative and, in general, less than −4 volts. This negative voltage passed to buffer transistor Q5 and then to Q13 to pass current to heat the block 18. At the same time transistor Q6 and the resistance shown are provided to provide additional current limiting characteristics so that the desired one amp. capacity of Q13 will not be exceeded. As the block is heated and as the control voltage tends to come to a −4 value, this negative voltage will be transmitted by the line indicated to an input pin of operational amplifier IC4-B. The other or second input pin of this amplifier is in a circuit interconnecting the −8 volt regulated source and a signal ground. Since the resistances used in this direct circuit are of equal value, the input at this second pin will be at approximately −4 volt. IC4-B as an amplifier, however, will essentially transmit or put out a voltage corresponding to the input voltage. At any time that the voltage is less than −4 volts, this low output voltage will appear at pin 4 of the op amp IC4-B and also at the base of the buffer transistors Q3 and Q4. When the voltage is low, the transistor Q4 will conduct, and a negative signal will be passed by the resistance R6. Since the indicators 35 and 37 are light emitting diodes and since they are connected in the circuit as indicated, the light 35 will be lit at the times when the block is being heated. When the voltage output at pin 4 of IC4-B is raised to −4 volt or above, the transistor Q3 will start to conduct, and thereafter the voltage passing the resistance R6 will be of opposite voltage and instantaneously and at the same time indicator 35 will turn off, and the light emitting diode 37 will be turned on. When the L.E.D. 37 is on, the external indication will be that the instrument has been brought to temperature, and sample studies and testing processes may be continued.

Figure 6:
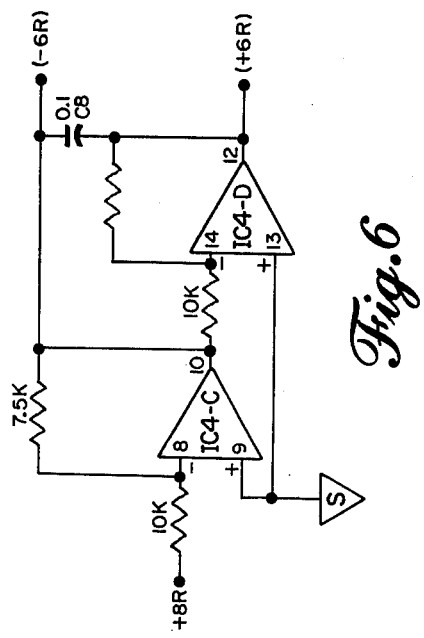
FIG. 6 is a circuit diagram of an auxiliary power supply for said embodiment.

The FIG. 6 illustration on this same sheet of drawings merely shows the circuit arrangement whereby the positive 8 volt regulated power source is used together with operational amplifier IC4-C and IC4-D to provide an output regulated power of plus and minus 6 volt. This regulated power source of plus and minus 6 volt is used in connection with timing and multiplexing components of the present embodiment which are shown in FIG. 7.

Figure 7:
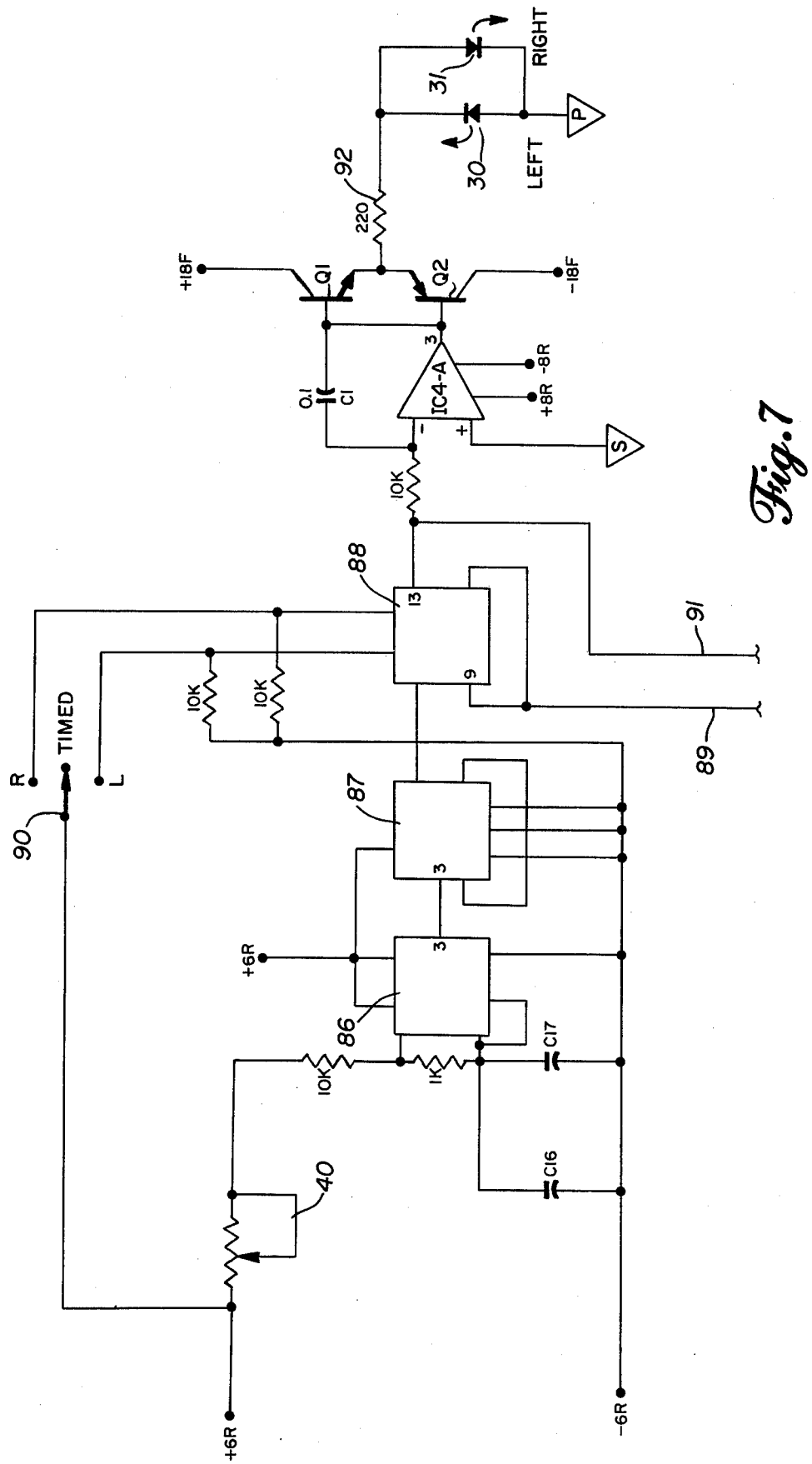
FIG. 7 is a circuit diagram for the timing oscillator and multiplex latch components of said invention.

A first of two timing device circuits that are used in connection with the practice of the present invention is shown in FIG. 7. Here a timing oscillator and associated circuits are used to provide a multiplexing latch output which will control the release of signals from the separate samples so that the signals received therefrom can be transmitted to the strip chart recorder 13. In connection with general practice of the invention, the multiplexing latch system, or a substitute therefor, is of considerable importance, since this component makes it possible to record information gained from two or more samples on a comparative basis through use of only a single pen recorder. The first clock or timing circuit is actually used as a switch device which will control release of signals from either the left or right cuvettes. As shown in FIG. 7, plus and minus 6-volt regulated power is applied to a rate adjusting variable resistor 40 which corresponds to the control knob shown on the operative representations for face 17 in FIG. 2, where dial markings indicate orientation for fast or slow values. This rate adjust control resistor is connected through the indicated resistance to an astable oscillator 86. The negative 6-volt source is likewise connected to this oscillator through capacitors C16 and C17. The outputs of astable oscillator 86 are timed pulses, the frequency of which will be controlled by adjustment of the variable resistor 40 and by the values for the input capacitors and resistors connected to oscillator 86. Desirably, the time rate for the output pulses can be adjusted between 0.4 of a second and 40 seconds. Oscillator 86 is connected next to an integrated circuit divide-by-two flip-flop 87, and the output from flip-flop 87 is connected to a multiplexing latch 88 which itself is of flip-flop characteristic likewise having a divide-by-two capability. It is the output from this multiplexing latch 88 which is interconnected to the signal system of the device by the lines 89 and 91 to control release of the signals on a multiplexed or alternating left and right basis. In order to establish a control other than one of multiplex characteristic, the switch 90 is provided. If this switch is turned to the right or to the left, the input signal into a multiplexing latch 88 will override the timed release established by such latch, and, accordingly, the control signal transmitted by the lines 89 and 91 will permit release of the right and left signals, respectively. In order to provide an indication of which signal is being transmitted to the chart recorder at any time, the signal in line 91 is also introduced to operational amplifier IC4-A. The output signal from this op amp rises and falls depending upon the input thereto. It is this changing signal from IC4-A which is introduced to the base of transistors Q1 and Q2, and since the transistors are of different type, the signal passing resistor 92 will be of changed polarity depending upon which transistor Q1 or Q2 is biased to conduct. This signal of changed polarity is introduced to the left and right L.E.D.s 30 and 31, and obviously only one of said L.E.D.s will be lit at any time due to the opposite bias thereof. With this arrangement whenever the left signal is being transmitted to the output of the device or to the strip chart recorder, the left signal light 30 will be on. Conversely, if a trace is being made of the signal associated with the right cuvette, the right light will be on. Movement of the switch 90 to the left and right positions will also bias the op amp IC4-A in a corresponding direction so that the signal lights will correctly indicate the source of the signal irrespective of whether the unit is in the multiplexing or in the manually selected mode. The signals carried by the lines 89 and 91 are continued into the FIG. 8 illustration, where the line 89 is connected to a right switch IC7-A, while the line 91 is connected to an integrated circuit IC7-B which provides a left switch to control output of signals from the left cuvette.

Figure 8:
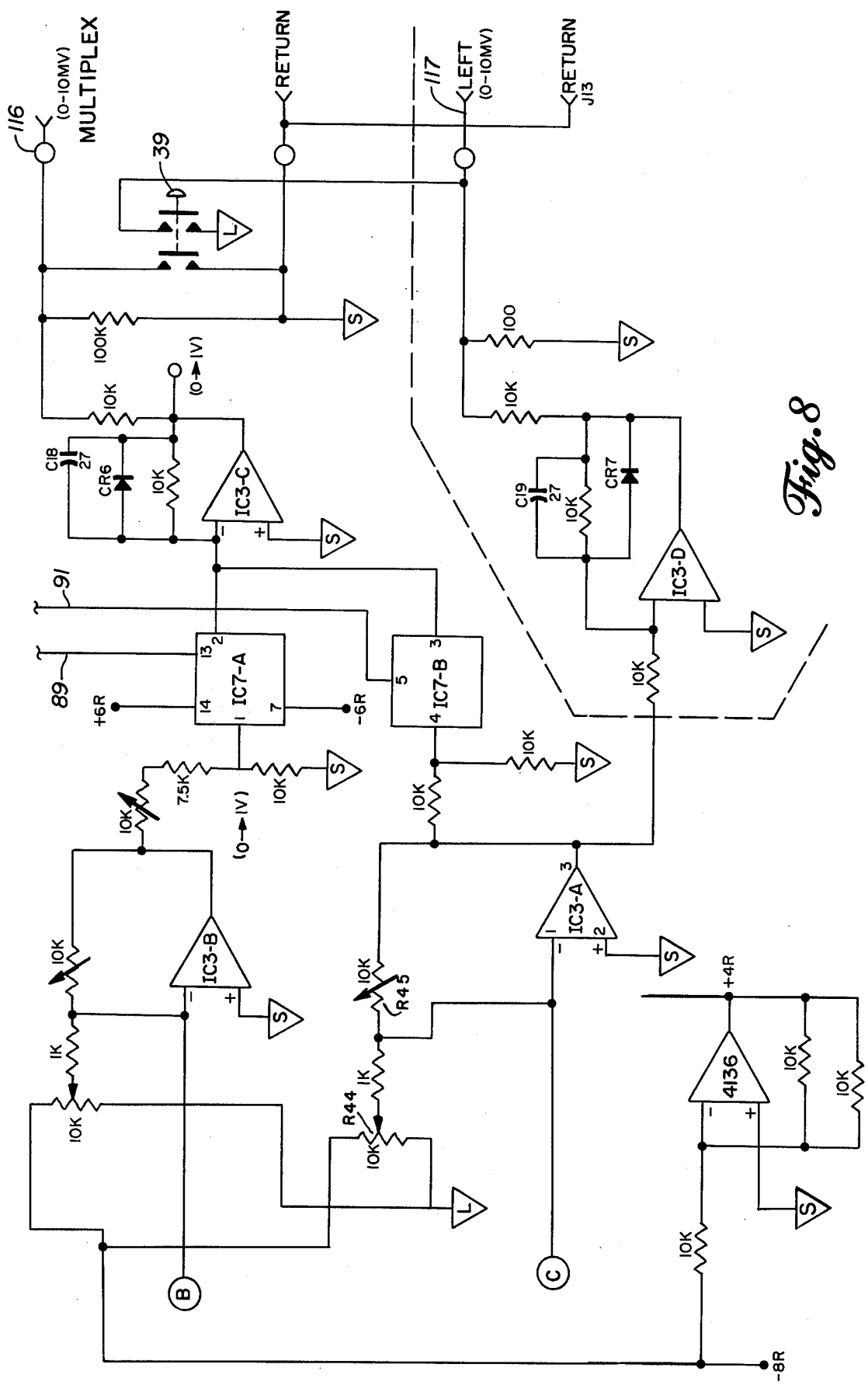
FIG. 8 is a circuit diagram for the light sensor amplifier circuits.
Figure 9:
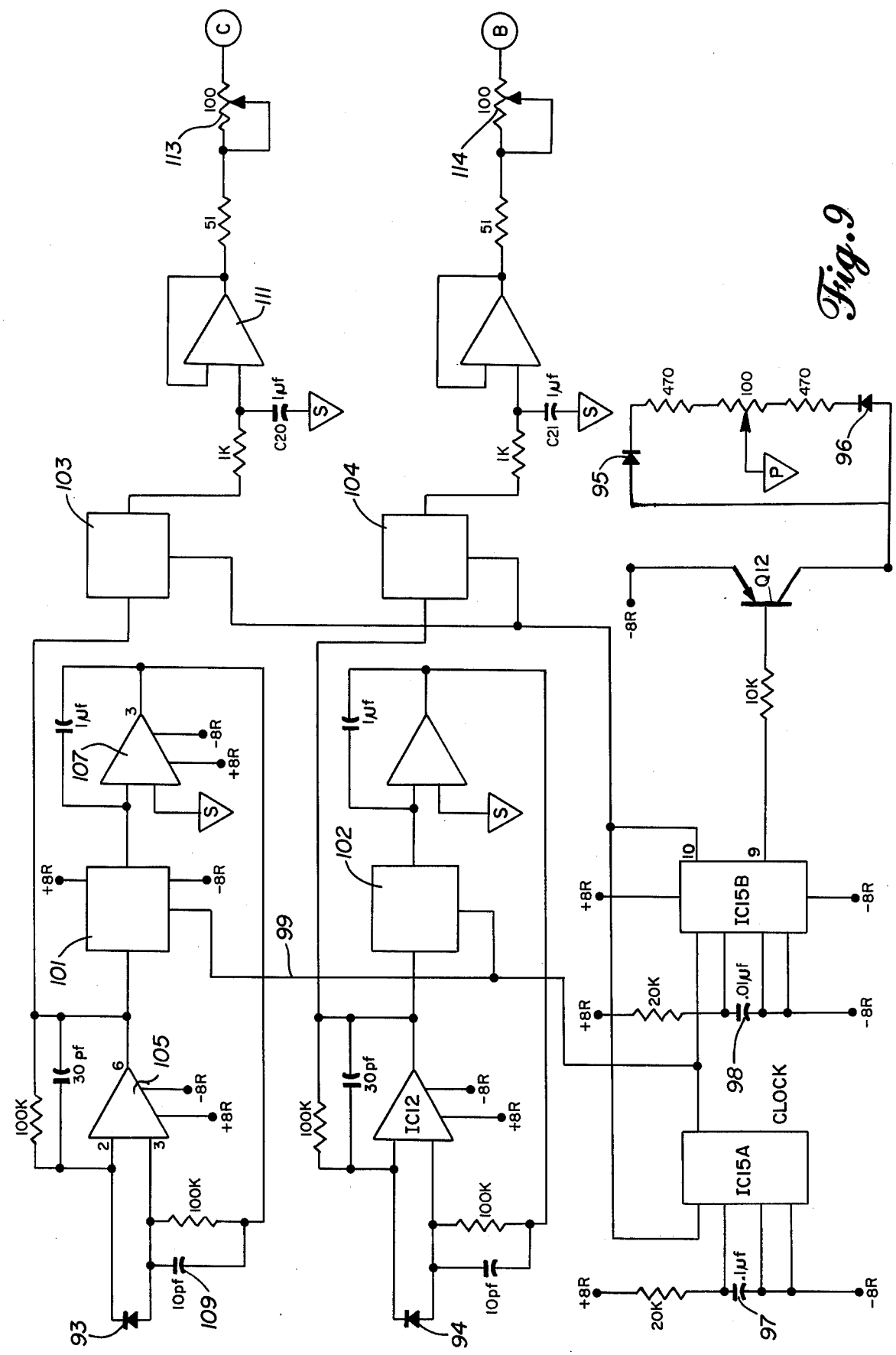
FIG. 9 is a circuit diagram for an ambient light correction circuit used with the circuits of FIG. 8.

The actual derivation of the left and right signals which are to be released by these left and right switches is best explained through conjoint presentation of the circuit diagrams constituting FIGS. 9 and 8. Starting first with FIG. 9 it will be seen that photodiodes are provided which are positioned adjacent the left and right cuvettes so that they will be activated by light passing through the cuvettes as the test process is undertaken and moves to completion. The left photodiode pickup is identified by the number 93, while the right photodiode is identified by number 94. The light that activates these photodiodes is provided by L.E.D. 95 for the left cuvette and L.E.D. 96 for the right cuvette. While the primary source of the light related signals is dependent upon illumination provided L.E.D.s 95 and 96, it is regretably true that the photodiode pickups 93 and 94 cannot usually be isolated from stray or ambient light disturbances even though most efficient laboratory operations might require and utilize a light blocking hood, filters or other light control devices. Laboratory use of the device has indicated that a universally improved operation is possible if all signal errors derived from ambient light influences could be eliminated. A second clock or timing component is incorporated in the preferred embodiment of the invention in order to eliminate or discount such ambient light influences. The desired time control or clock used for this purpose and which also provides the control for turning on and off L.E.D.s 95 and 96 is provided by integrated circuits IC15-A and IC15-B and their associated resistances and capacitances. Integrated circuits IC15-A and IC15-B are monostable multi-vibrators interconnected one to the other so that an output pulse derived from IC15-A activates integrated circuit IC15-B which then itself puts out a pulse that is fed back to IC15-A. These monostable one-shot multi-vibrators have a ten to one characteristic dependent on the values for their separate capacitors 97 and 98. The first use of this clock combination depends on the output at pin 9 of IC15-B. When this output is of low voltage or off, the signal applied to the base of transistor Q12 will cause the L.E.D.s 95 and 96 to be simultaneously lit. Due to the time characteristics of the clock, the L.E.D.s will be on only one-tenth of the total time period. Since the lights 95 and 96 are not on continuously, the signal output from photodiodes 93 and 94 will not be continuous.

In order to eliminate or subtract the signals that might be generated by stray or ambient light conditions falling on the photodiodes 93 and 94, the clock capabilities of IC15-A and IC15-B are further used to provide additional switching capability. A first output from the clock components is transmitted by the lines 99 to switches 101 and 102. The clock signal from pin 10 of IC15-B is also connected to switches 103 and 104. These switches 101 through 104 are used on an alternating basis to block the transmission of any signal that may be derived from ambient light influences. The operation is best described in connection with left photodiode 93, which is of a type having a changing current generation characteristic when it is exposed to light. The changing signal is introduced at pin 2 of op amp 105. The op amp 105 is connected into plus and minus 8-volt regulated power as indicated. If switch 101 is only closed when L.E.D. 95 is off, the output signal from 105 will only be passed to integrator op amp 107 when L.E.D 95 is off. With this arrangement the system is made insensitive to ambient light, since the output from 105 is connected to integrator components, inclusive of op amp 107 and capacitor 109, when the L.E.D is off. This total integrated output is connected to the non-inverting terminal at pin 3 of op amp 105 to provide an offset voltage that cancels any unwanted output due to ambient light by reducing the voltage from op amp 105 to zero when the L.E.D. is off. When the clock multi-vibrators IC15A and IC15B turn L.E.D. 95 on again, they also open the switch 101 to disconnect the integrator 107 from the output at 105. Capacitor 109, however, holds the previously established offset voltage due to ambient light on the non-inverting terminal 3 of 105 so that during the period when the L.E.D. 95 is on the net voltage output from op amp 105 is derived only from the L.E.D light source. Further, when the L.E.D. 95 is on, the switch 103 will be closed, and the net voltage output from op amp 105 will be applied to capacitor C20. Capacitor C20 and the switch 103, accordingly, have a sample-and-hold characteristic so that the signal applied to op amp 111 is solely dependent upon light from the L.E.D., and any stray light influences are, accordingly, eliminated. The output signal from 111 may be passed through a variable resistor 113 to the point C which appears on this FIG. 9 and also on FIG. 8. Changes in the resistance for variable resistor 113 may be used to balance the total output of the left identified circuits so that the final output signal will be compatible with the strip chart recorder or other readout device being used.

All of the components described in connection with the left photodiode circuits are duplicated for the right photodiode 94, and the operation thereof is, accordingly, similar. Variable resistance 114 can, accordingly, also be used to adjust the output signal values for the right channels of the instrument.

The signals for the left channels appearing at C on FIG. 9 is introduced at C in FIG. 8. This signal is applied to the operational amplifier IC3-A with the output signal thereof at pin 3 being connected to the feedback variable resistor R45 and through variable resistance R44 to the minus 8-volt regulated power supply. The output at pin 3 is also introduced past a suitable resistance to left multiplexing switch IC7-B. Accordingly, when this switch is closed, a signal will be introduced to the op amp IC3-C and thence to a multiplexed output 116 which is itself an output for the interconnecting line 12 to the strip chart recorder 13. This multiplexed signal or any other signal derived from the right channels and introduced past swtich IC7-B and op amp IC3-C will be similarly introduced to the strip chart recorder. Actually the output signal from op amp IC3-C has a zero-to-one volt range, whereas many strip chart recorders have a zero-to-ten millivolt range. The 10K and 100K resistances on the output from IC3-C are used to reduce the output voltage to a value compatible with a 10 millivolt strip chart recorder. On FIG. 8 the chart zero switch 39 from FIG. 2 is also indicated. When this switch is closed, any and all signals will be shorted out, and, accordingly, the position of the recording pen 16 for the strip chart recorder 13 can be adjusted for a zero signal input.

The circuit components shown within the broken line representation provide an additional capability for the instrument, inasmuch as these components can be used also to receive the signal from the left current summer IC3-A that is normally introduced past the left switch IC7-B to the multiplex output 116. The left output amplifier IC3-D and the circuits associated therewith are essentially duplicates of IC3-C and its associated circuits. Accordingly, an output may be derived at the output 117 that will at all times provide a reading of the left channels. The alternate output can be used to drive a second pen of a multi-pen strip chart recorder, or it could be directly connected to the single recorder pen 16 indicated so that a single and continuous plot would be provided for the left related signals. The fact that L.E.D. 95 is not on all the time will not significantly disturb the signal trace derived, since the on and off switching of the L.E.D. actually occurs at a substantially fast rate.

We claim:

1. Instrument apparatus for the study of time and process related changes in a plurality of separate samples that are to be subjected to influences that will change characteristics of said samples comprising a base component providing a plurality of receptacles adapted to receive a plurality of samples, sensor means providing a plurality of separate sequential status and condition related signals for each of said samples as testing continues over a period of time, a single display component providing a readout for the sequential signals derived and related to a plurality of samples, and a time related switching component for alternately releasing the signals related to each sample for cyclical and non-simultaneous display.

2. The instrument apparatus as set forth in claim 1 and further comprising signal recording means as said display component to provide a visual record of said signals.

3. The instrument apparatus as set forth in claim 2 wherein said signal recording means is a chart recorder providing a chart that moves at a regulated rate for the reception of said signals whereby the signals related to separate samples are separated one from the other on a real time basis.

4. The instrument apparatus as set forth in claim 3 wherein said signal recording means is a strip chart recorder of marking pen type, and further comprising means interconnecting a plurality of said sample related signals to one said marking pen whereby a single pen will cyclically record signals from a plurality of samples.

5. The instrument apparatus as set forth in claim 3 wherein said signal recording means is a single pen strip chart recorder, and further comprising means interconnecting a plurality of said sample related signals to said single pen for cyclically recording the signals from said plurality of samples whereby the output record is inclusive of a plurality of separate signal segment traces interconnected by time spaced lines.

6. The instrument apparatus as set forth in claim 5 wherein said switching component allots equal time for the release of signals from each of said samples and the time spaced lines are, accordingly, equidistant apart along the time scale of said chart.

7. The instrument apparatus as set forth in claim 5 wherein the separate signal segment traces for each sample in total delineate a plurality of curves in juxtaposed position on said chart with each curve characterizing the related individual sample whereby the characteristics of a plurality of samples may be conveniently compared.

8. The instrument apparatus as set forth in claim 6 wherein the length of segment traces for separate samples in a time sequential following order is indicative of the then occurring rates of change for each of said samples.

9. The instrument apparatus as set forth in claim 6 wherein said switching component is inclusive of electronic multiplexing circuits.

10. The instrument apparatus as set forth in claim 9 wherein said multiplexing circuits are inclusive of an oscillator component and signal divider elements.

11. The instrument apparatus as set forth in claim 9 and further comprising a status switch for overriding selection of the sample signal that is to be displayed.

12. The instrument apparatus as set forth in claim 11 wherein said status switch can be used to selectively display a single sample signal or multiple sample signals on a cyclically simultaneous basis.

13. The instrument apparatus as set forth in claim 1 wherein said samples have changing light transmissivity characteristics and said sensor means are light sensors, and further comprising a light source for directing light through said samples.

14. The instrument apparatus as set forth in claim 13 wherein said light sensors comprise separate photodiodes for each sample.

15. The instrument apparatus as set forth in claim 14 and further comprising clock control apparatus for selectively releasing signals from each said photodiode.

16. The instrument apparatus as set forth in claim 15 wherein said clock control apparatus is used for blocking sensed light signals derived from ambient light influences.

17. The instrument apparatus as set forth in claim 16 and further comprising a plurality of switches interconnected with said clock control apparatus for alternating actuation thereby.

18. The instrument apparatus as set forth in claim 17 and further comprising signal summing elements interconnected to said sensors and switches whereby the strength of signals derived from ambient light influences are subtracted from the total signal strength sensed by said light sensors.

19. The instrument apparatus as set forth in claim 16 for use with samples the changing characteristics of which are influenced by changes in temperature, and further comprising means for regulating the temperature of said support base and, accordingly, of the samples received in the receptacles thereof.

20. The instrument apparatus as set forth in claim 19 and further comprising a transistor for use as a heat source mounted on said support base, heat sensitive means having a changing resistance characteristic with changes in temperature for sensing the temperature of said support base, and circuit means interconnecting said heat sensitive element and the base of said transistor whereby said transistor heat source acts additionally as its own switch to turn on and off as the temperature of the support base decreases and increases.

21. The instrument apparatus as set forth in claim 16 for use with samples the changing characteristics of which are influenced by agitation thereof, and further comprising stirring elments disposed under each of said sample receptacles, rotary magnets for each of said stirring elements, and stirring bars of magnetisable capability for disposition in said samples for rotation under the influence of said rotary magnets.

22. The instrument apparatus as set forth in claim 21 and further comprising control means for regulating the speed of said stirring elements, said control means being inclusive of a Hall sensor disposed adjacent one of said rotary magnets whereby pulsed signals are emitted by said Hall sensor.

23. The instrument apparatus as set forth in claim 22 and further comprising signal summing components connected to the output of said Hall sensors to provide a control signal related to the speed of said stirring elements.

24. Instrument apparatus for the study of time and process related changes in samples that are to be subjected to controlled influences, inclusive of internal agitation, comprising a sample support base component providing a plurality of receptacles adapted to receive a plurality of samples, a plurality of stirring motors with each motor disposed under one of said receptacles, rotary magnets for each of said motors disposed to rotate beneath said receptacles, stirring bars of magnetisable capability for disposition in said samples for rotation under the influence of said rotary magnets, a power circuit for said instrument and interconnected to said stirring motors for powering rotation thereof, a Hall sensor disposed adjacent one of said rotary magnets whereby pulsed signals are emitted by said Hall sensor, a control transistor for said instrument apparatus with the collector and emitter thereof being disposed in the power circuit for said stirring motors, and signal summing components connected intermediate said Hall sensor and the base of said control transistor whereby the output of said signal summing component operates to control the output voltage of said power circuit passing said control transistor for the regulation of the speed of said stirring motors.

25. The instrument apparatus as set forth in claim 24 and further comprising clamping components for blocking out a portion of the signal output of said Hall sensor.

26. The instrument apparatus as set forth in claim 25 and further comprising integrated circuit elements for said signal summing components disposed intermediate said clamping components and the base of said control transistor.

27. The instrument apparatus as set forth in claim 26 and further comprising a variable resistance speed control component inclusive of a wiper, and circuit means intermediate the wiper of said speed control and the output of one of said integrated circuit elements whereby a combined signal dependent upon the summing functions of at least one of said integrated circuits and the signal from the wiper of said speed control is used for application to the base of said control transistor whereby the stirring motors may be operated at varied speeds.

28. The instrument apparatus as set forth in claim 27 wherein said variable resistance speed control is interconnected at a point intermediate said integrated circuit elements and the total combined signal from a summing integrated circuit element and said speed control is itself applied to an integrated circuit, the output of which is connected to the base of the control transistor.

29. The instrument apparatus as set forth in claim 28 and further comprising a speed indicator connected to the output of said summing integrated circuit for indication of the rotary speed of said Hall sensor and, accordingly, of said stirring motors.

30. The instrument apparatus as set forth in claim 29 wherein said speed indicator is of limited range less than the full speed range for said motors, and further comprising resistance changing components in the circuits therefor whereby multiple rotary speed ranges may be indicated.

31. The instrument apparatus as set forth in claim 24 and further comprising power transmission means for interconnecting said stirring motors whereby the rotary speed of said motors is controlled one with respect to the other.

32. The instrument apparatus as set forth in claim 31 wherein said stirring motors are connected in series and said power transmission means is a belt element for mechanically interconnecting the shafts of said stirring motors.

33. The instrument apparatus as set forth in claim 31 wherein said power transmission means interconnects said stirring motors for rotation at the same speed.

34. Instrument apparatus for the study of time and process related changes in samples that are to be subjected to controlled influences, inclusive of temperature, comprising a sample support base component providing a receptacle for holding said sample, a power circuit providing voltage outputs of increased and decreased value, a transistor for use as a heat source mounted on said support base, a thermistor element having a changing resistance characteristic with changes in temperature for sensing the temperature of said support base, a variable resistance element for the selection of desired instrument temperatures, means for interconnecting said thermistor and variable resistance to varied voltage outputs of said power circuit, and means interconnecting the base of said transistor at a circuit point intermediate said thermistor and variable resistance for biasing said transistor base with said transistor being biased for conductance at a voltage intermediate said power circuit varied voltage outputs whereby said transistor heat source acts additionally as its own switch to turn on and off as the temperature of the support base decreases and increases.

35. The instrument apparatus as set forth in claim 34 and further comprising an amplifier component positioned intermediate said circuit point and the base of said transistor for further control of said transistor heat source.

36. The instrument apparatus as set forth in claim 35 and further comprising resistance and diode controls in the feedback circuits of said amplifier component.

37. The instrument apparatus as set forth in claim 36 and further comprising a temperature status indicator circuit connected to the feedback for said amplifier component, said temperature status indicator circuit being inclusive of paired NPN and PNP transistors having the bases thereof coupled in said status indicator circuit in a manner whereby only one of said transistors will conduct at any one time, and paired light emitting diodes connected to the common output of said paired transistors with the diode contacts being reversed whereby only one of said diodes will be lit at any time for indicating the status of said transistor heat source.

38. A method for displaying representations of rates of change for a plurality of samples subjected to process and time influences comprising providing a plurality of samples for testing, obtaining substantially continuous output status signals from each of said samples, switching each of said sample related signals on and off in a sequential manner whereby only one output signal is released at a time, applying the resulting released signal to a single marking element of a chart recorder wherein the chart is moved at a regular real time rate with said marking element accordingly moving from one separate sample related signal position to another as the signal outputs are switched, and the total trace obtained is made up of separate segmental traces interconnected by time based lines whereby the length of segmental traces is indicative of rates of change for the related samples.

39. The method as set forth in claim 38 for testing biological fluid samples.

40. The method as set forth in claim 39 wherein the biological fluids are progressively tested for light transmissivity, and the output signals are indicative thereof.

41. The method as set forth in claim 39 and further comprising the step of controlling the temperatures to which the samples are subjected.

42. The method as set forth in claim 39 and further comprising the step of internally agitating each of said samples by stirring the samples at regulable rates as the process continues.

* * * * *